(12) United States Patent
Nayak

(10) Patent No.: US 10,352,972 B1
(45) Date of Patent: Jul. 16, 2019

(54) PROGRAMMABLE MULTI-SENSOR MEASUREMENT AND CONTROL SYSTEM ADDRESSING EXPANDABLE MODULES

(71) Applicant: Siemens Industry, Inc., Alpharetta, GA (US)

(72) Inventor: Amit Nayak, Atlanta, GA (US)

(73) Assignee: SIEMENS INDUSTRY, INC., Alpharetta, GA (US)

( * ) Notice: Subject to any disclaimer, the term of this patent is extended or adjusted under 35 U.S.C. 154(b) by 0 days.

(21) Appl. No.: 16/113,082

(22) Filed: Aug. 27, 2018

(51) Int. Cl.
*G01R 31/02* (2006.01)
*G01R 19/25* (2006.01)
(Continued)

(52) U.S. Cl.
CPC .......... *G01R 19/2513* (2013.01); *G01S 19/13* (2013.01); *G05B 19/054* (2013.01);
(Continued)

(58) Field of Classification Search
CPC .. H04L 65/4069; H04W 84/12; H04W 40/02; B62D 41/00; G01C 21/26; G01S 3/80; G07C 5/008; G07C 5/0891; G08G 1/205; G08G 1/0116; G08G 1/04; G08G 1/052; G08G 1/094; H04M 7/006; F24F 2221/40; H05K 7/20745; H05K 7/20754; G06F 13/364; G06F 13/4282; G06F 1/26; G06F 1/266; G06F 1/3209; G06F 1/3246; G06F 1/3287; G06F 2200/261; H01H 47/00; H01R 25/003; H02J 13/0062; H02J 3/14; Y02B 70/3225; Y02B 90/226; Y02B 90/2638; Y02D 10/151; Y02D 10/175; Y04S 20/16; Y04S 20/222; Y04S 40/124; Y10T 307/25; Y10T 307/305; Y10T 307/406; Y10T 307/414; Y10T 307/445; Y10T 307/453; Y10T 307/50; Y10T 307/76; A01G 2031/006; A01G 31/02; A01G 31/06; A01K 61/10; A01K 61/80; A01K 63/003; A01K 63/04; A01K 63/045; A01K 63/047; A01K 63/065; B64C 1/00;
(Continued)

(56) References Cited

U.S. PATENT DOCUMENTS

2011/0296224 A1* 12/2011 Ewing ........................ G06F 1/26
713/330
2013/0194126 A1* 8/2013 Paoletti .................... G01S 13/04
342/55
(Continued)

*Primary Examiner* — Daniel Previl

(57) ABSTRACT

A measurement and control system comprises a housing and an electrical power distribution sub-system. The housing includes a plurality of addressable and programmable modules, a module rack that is expandable and having a length, and a main controller configured to communicate with the plurality of addressable and programmable modules. Each of the addressable and programmable module is installed on the module rack in a sequential configuration and is addressable based on a specific physical location of it across the length of the module rack. The main controller communicates with the plurality of addressable and programmable modules by addressing through a communication network. The electrical power distribution sub-system is configured to monitor inputs and signals from the each addressable and programmable module.

20 Claims, 7 Drawing Sheets

(51) Int. Cl.
   *H02B 1/03* (2006.01)
   *H02B 1/06* (2006.01)
   *H05K 7/14* (2006.01)
   *G05B 19/05* (2006.01)
   *G08B 5/36* (2006.01)
   *G01S 19/13* (2010.01)

(52) U.S. Cl.
   CPC ............ *G08B 5/36* (2013.01); *H02B 1/03* (2013.01); *H02B 1/06* (2013.01); *H05K 7/1465* (2013.01); *H05K 7/1467* (2013.01); *H05K 7/1481* (2013.01); *G05B 2219/13144* (2013.01); *G05B 2219/15038* (2013.01)

(58) Field of Classification Search
   CPC ..... B64C 37/02; B64C 39/08; C02F 2101/16; C02F 2103/20; C02F 3/32; G06K 9/00785; Y02P 60/216; Y02P 60/642; Y02W 10/37
   USPC ....... 340/638, 644, 641, 648, 680, 683, 675, 340/686.1, 691.3, 693.1, 693.3, 2.26, 340/825.22, 3.9
   See application file for complete search history.

(56) References Cited

U.S. PATENT DOCUMENTS

| | | | |
|---|---|---|---|
| 2015/0134123 A1* | 5/2015 | Obinelo | G05B 15/02 700/277 |
| 2017/0181328 A1* | 6/2017 | Shelnutt | H05K 7/20836 |
| 2018/0113682 A1* | 4/2018 | Horvath | G06F 9/451 |

* cited by examiner

FIG. 8

| Single Phase Monitor Modbus Addresses | 21 Position Rack Modbus Addresses | 15 Position Rack Modbus Addresses | 9 Position Rack Modbus Addresses | 6 Position Rack Rotary Switch Settings | 6 Position Rack Modbus Addresses | 3 Position Rack Rotary Switch Settings | 3 Position Rack Modbus Addresses |
|---|---|---|---|---|---|---|---|
| 1 | 1 | 1 | 1 | 0(8) | 1 | 0 | 1 |
| 2 | 2 | 2 | 2 |  | 2 |  | 2 |
| 3 | 3 | 3 | 3 |  | 3 |  | 3 |
| 4 | 4 | 4 | 4 |  | 4 |  |  |
| 5 | 5 | 5 | 5 |  | 5 | 1 | 5 |
| 6 | 6 | 6 | 6 |  | 6 |  | 6 |
| 7 | 7 | 7 | 7 |  |  |  | 7 |
| 8 | 8 | 8 | 8 |  |  |  |  |
| 9 | 9 | 9 | 9 | 1(9) | 9 | 2 | 9 |
| 10 | 10 | 10 |  |  | 10 |  | 10 |
| 11 | 11 | 11 |  |  | 11 |  | 11 |
| 12 | 12 | 12 |  |  | 12 |  |  |
| 13 | 13 | 13 |  |  | 13 | 3 | 13 |
| 14 | 14 | 14 |  |  | 14 |  | 14 |
| 15 | 15 | 15 |  |  |  |  | 15 |
| 16 | 16 |  |  |  |  |  |  |
| 17 | 17 |  | Open Address Space | 2 | 17 | 4 | 17 |
| 18 | 18 |  |  |  | 18 |  | 18 |
| 19 | 19 |  |  |  | 19 |  | 19 |
| 20 | 20 | Open Address Space |  |  | 20 |  |  |
| 21 | 21 |  |  |  | 21 | 5 | 21 |
| 22 |  |  |  |  | 22 |  | 22 |
| 23 | Open Address Space |  |  |  |  |  | 23 |
| 24 |  |  |  |  |  |  |  |
| 25 |  |  |  | 3 | 25 | 6 | 25 |
| 26 |  |  |  |  | 26 |  | 26 |
| 27 |  |  |  |  | 27 |  | 27 |
| 28 |  |  |  |  | 28 |  |  |
| 29 |  |  |  |  | 29 | 7 | 29 |
| 30 |  |  |  |  | 30 |  | 30 |
| 31 |  |  |  |  |  |  | 31 |
| 32 |  |  |  |  |  |  |  |

| Single Phase Monitor Modbus Addresses | 21 Position Rack Modbus Addresses | 15 Position Rack Modbus Addresses | 9 Position Rack Modbus Addresses | 6 Position Rack Rotary Switch Settings | 6 Position Rack Modbus Addresses | 3 Position Rack Rotary Switch Settings | 3 Position Rack Modbus Addresses |
|---|---|---|---|---|---|---|---|
| 33 | 33 | 33 | 33 | 4 | 33 | 8 | 33 |
| 34 | 34 | 34 | 34 |   | 34 |   | 34 |
| 35 | 35 | 35 | 35 |   | 35 |   | 35 |
| 36 | 36 | 36 | 36 |   | 36 |   |   |
| 37 | 37 | 37 | 37 |   | 37 | 9 | 37 |
| 38 | 38 | 38 | 38 |   | 38 |   | 38 |
| 39 | 39 | 39 | 39 |   |   |   | 39 |
| 40 | 40 | 40 | 40 |   |   |   |   |
| 41 | 41 | 41 | 41 | 5 | 41 | A | 41 |
| 42 | 42 | 42 |   |   | 42 |   | 42 |
| 43 | 43 | 43 |   |   | 43 |   | 43 |
| 44 | 44 | 44 |   |   | 44 |   |   |
| 45 | 45 | 45 |   |   | 45 | B | 45 |
| 46 | 46 | 46 |   |   | 46 |   | 46 |
| 47 | 47 | 47 |   |   |   |   | 47 |
| 48 | 48 |   |   |   |   |   |   |
| 49 | 49 |   |   | 6 | 49 | C | 49 |
| 50 | 50 |   |   |   | 50 |   | 50 |
| 51 | 51 | Open Address Space |   |   | 51 |   | 51 |
| 52 | 52 |   |   |   | 52 |   |   |
| 53 | 53 |   | Open Address Space |   | 53 | D | 53 |
| 54 |   |   |   |   | 54 |   | 54 |
| 55 |   |   |   |   |   |   | 55 |
| 56 |   |   |   |   |   |   |   |
| 57 |   |   |   | 7 | 57 | E | 57 |
| 58 | Open Address Space |   |   |   | 58 |   | 58 |
| 59 |   |   |   |   | 59 |   | 59 |
| 60 |   |   |   |   | 60 |   |   |
| 61 |   |   |   |   | 61 | F | 61 |
| 62 |   |   |   |   | 62 |   | 62 |
| 63 |   |   |   |   |   |   | 63 |

PROGRAMMABLE MULTI-SENSOR MEASUREMENT AND CONTROL SYSTEM ADDRESSING EXPANDABLE MODULES

BACKGROUND

1. Field

Aspects of the present invention generally relate to a programmable multi-sensor measurement and control system that addresses expandable modules in applications such as power monitoring, environmental sensing, building automation, and sub-billing systems.

2. Description of the Related Art

In an electrical power distribution system there are often requirements for end user to monitor various types of inputs and signals from sensors. For example, a system may be designed to measure the current, voltage, and energy consumption of several circuits. The system can consist of a controller, racks, cables, meter modules and current transformers (CTs) that can be tailored to the application. The CTs may be mounted along the termination points of each breaker pole being metered. The conductor passes through the appropriate current sensor before terminating at the breaker. Each CT is terminated into a meter module that in turn is mounted in a rack. The racks get power from and communicate back to the controller through cables.

However, most measurement and control systems are often discrete components which need to be installed separately. The installation of separate systems has the potential of causing multiple problems for the end user namely:

a. The end user has to deal with multiple entities or vendors or products for the installation of the separate systems.
b. The individual measurement and control systems may have proprietary communication protocols which may preclude them from communicating with each other or to use an integrated monitoring software system.
c. The electrical power distribution system may not have adequate space for installing separate systems which may require their own power supplies, interconnection elements etc.

Therefore, there is an urgent need for controllably managing placement and operation of modules and sensors which may measure or control various parameters in an electrical power distribution system.

SUMMARY

Briefly described, aspects of the present invention relate to controllably managing placement and operation of modules and sensors which may measure or control various parameters such as the current, voltage, and energy consumption in an electrical power distribution system. A programmable multi-sensor measurement and control system addresses expandable modules in applications such as power monitoring, environmental sensing, building automation, and sub-billing systems. An integrated programmable multi-sensor measurement and control system comprises a main controller, a plurality of programmable modules, and a variety of module racks having different position defining and sensing mechanisms. Rack addresses identify the physical location of the modules in module racks. A master/slave model of communication is used where one device or process has unidirectional control over one or more other devices.

In accordance with one illustrative embodiment of the present invention, a measurement and control system is provided. The measurement and control system comprises a housing including a plurality of addressable and programmable modules at least one of which including at least one of a metering element, a logic element, a control element, a monitoring element and a sensing element, and a module rack that is expandable and having a length. Each of the addressable and programmable module of the plurality of addressable and programmable modules are installed on the module rack in a sequential configuration such that the each of the addressable and programmable module of the plurality of addressable and programmable modules is addressable on the module rack based on a specific physical location of each addressable and programmable module of the plurality of addressable and programmable modules across the length of the module rack. The housing further comprises a main controller configured to communicate with the plurality of addressable and programmable modules by addressing through a communication network each addressable and programmable module of the plurality of addressable and programmable modules. The measurement and control system further comprises an electrical power distribution subsystem coupled to each addressable and programmable module of the plurality of addressable and programmable modules and is configured to monitor inputs and signals from each addressable and programmable module of the plurality of addressable and programmable modules.

BRIEF DESCRIPTION OF THE DRAWINGS

FIG. 8 indicates rack addresses for left setting on module racks in accordance with an exemplary embodiment of the present invention.

FIG. 9 indicates rack addresses for right setting on module racks in accordance with an exemplary embodiment of the present invention.

DETAILED DESCRIPTION

To facilitate an understanding of embodiments, principles, and features of the present invention, they are explained hereinafter with reference to implementation in illustrative embodiments. In particular, they are described in the context of a programmable multi-sensor measurement and control system that addresses expandable modules in metering type applications. The system may comprise module racks having different position defining and sensing mechanisms. The system may controllably manage placement and operation of modules and sensors which measure the current, voltage, and energy consumption of an electrical power distribution system. Embodiments of the present invention, however, are not limited to use in the described devices or methods.

The components and materials described hereinafter as making up the various embodiments are intended to be illustrative and not restrictive. Many suitable components and materials that would perform the same or a similar function as the materials described herein are intended to be embraced within the scope of embodiments of the present invention.

Figure 1:
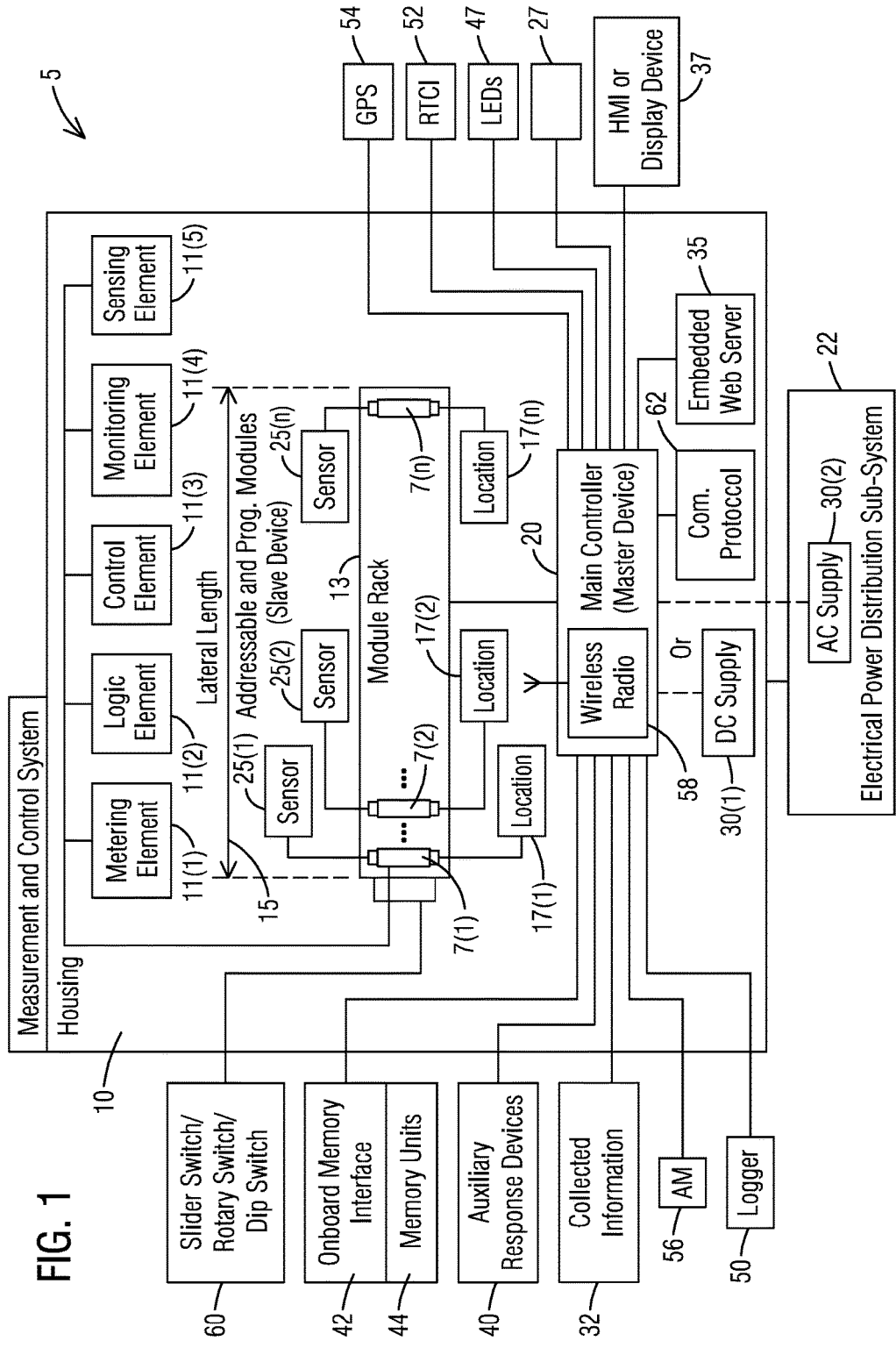
FIG. 1 illustrates a representation of a programmable multi-sensor measurement and control system that addresses expandable modules in applications in accordance with an exemplary embodiment of the present invention.

Consistent with one embodiment of the present invention, FIG. 1 represents a representation of a programmable multi-sensor measurement and control system 5 that addresses one or more expandable modules 7(1-n) in metering type applications in accordance with an exemplary embodiment of the present invention. The one or more expandable modules 7(1-n) may be addressable and programmable modules. Examples of the other embodiments of applications include power monitoring, environmental sensing, building automation, and sub-billing systems.

The programmable multi-sensor measurement and control system 5 may include a number of discrete components which may be installed separately. The programmable multi-sensor measurement and control system 5 may include a housing 10 that includes the expandable modules 7(1-n). At least one of the expandable module 7 may include a metering element 11(1), a logic element 11(2), a control element 11(3), a monitoring element 11(4) and/or a sensing element 11(5). The housing 10 may include a module rack 13 having a lateral length 15. The module rack 13 may be expandable in terms of a number of expandable modules 7 that can be installed together in the system 5. The housing 10 may be integrated with any one of a panel-board, a switchboard, a switch-gear, or a busway panel.

Each of the plurality of expandable modules 7(1-n) may be installed on the module rack 13 in a sequential configuration such that each of the plurality of expandable modules 7(1-n) is addressable on the module rack 13 based on a specific physical location 17(1-n) of each of the plurality of expandable modules 7(1-n) across the lateral length 15 of the module rack 13. The housing 10 may include a main controller 20 configured to communicate with the plurality of expandable modules 7(1-n) by addressing them through a communication network. The module rack 13 may include a slider switch/rotary switch/dip switch 60 for addressing the modules 7(1-n).

The programmable multi-sensor measurement and control system 5 may include an electrical power distribution sub-system 22 coupled to each of the plurality of modules 7(1-n) and is configured to monitor inputs and signals from the each of the plurality of expandable modules 7(1-n). Each of the plurality of expandable modules 7(1-n) is connected with an individual sensor assembly such as sensors 25(1-n).

The programmable multi-sensor measurement and control system 5 may use a communication protocol which enables data to be exported through the main controller 20 to an external electrical power monitoring system 27. The main controller 20 provides programmability access to any downstream connected modules of the plurality of expandable modules 7(1-n).

The main controller 20 is configured to receive 3 phase voltage information when connected to 120-600 V AC, 50/60 Hz signals. The main controller 20 is configured to be powered through a DC electric power supply 30(1) such that the main controller 20 distributes further a required electric power to the each of the plurality of expandable modules 7(1-n). The main controller 20 is alternatively configured to be powered directly from an AC electric power supply 30(2) instead of the DC electric power supply 30(1).

The main controller 20 is configured to communicate with the each of the plurality of expandable modules 7(1-n) to program the each of the plurality of expandable modules 7(1-n) to upgrade their firmware and modify any functional or logic blocks. The main controller 20 is configured to perform a translation of collected information 32 and provide an interface to an external source. The main controller 20 is configured to monitor health of any connected modules of the each of the plurality of expandable modules 7(1-n) by periodically performing a self test routine.

The main controller 20 while communicating with programmable logic controller (PLC) modules among the plurality of expandable modules 7(1-n) is configured to push a configured logic to a PLC module as required. The main controller 20 is configured to act as a translator or a gateway function wherein data recorded from one or more addressable and programmable modules of the plurality of expandable modules 7(1-n) is translated to other widely used industry protocols. The main controller 30 includes an embedded web server 35 accessible by an end customer to perform on-board configuration and review of local data. The embedded web server 35 is a web server which resides in a hardware device and is implemented in the software/firmware of the hardware device. The embedded web server 35 is expected to respond to requests from a client such as Internet web browsers running on computing devices (laptop/pc etc.). The main controller 20 is connected to a display device 37 with a Human Machine Interface (HMI) wherein a user is able to view data, access and review the collected information 32.

The main controller 20 is connected to auxiliary responsive devices 40 including audible support systems or alarm devices for providing system alerts conditions or immediate responses based on collected information 32. The main controller 20 to provide logging of the collected information 32 on an onboard memory interface 42 and include removable/portable memory units 44 for recording data logs, alarm logs, and system event logs.

The main controller 20 includes a plurality of Light Emitting Diodes (LEDs) 47 to display a current status of the system, a communication status and failure modes. The main controller 20 further includes a logger 50 such as a collected data time stamper to allow an end user to note a time of any events and enable a time synchronization using a Network Time Protocol (NTP). The main controller 20 further includes a real-time clock interface (RTCI) 52 to give software and embedded web pages a real-time clock information for alternate time synchronization. The main controller 20 further includes a Global Positioning System (GPS) device 54 to record a location of the main controller using location synchronization with the GPS device 54 and provide location based system wide topology or hierarchy of information. In another embodiment, the main controller 20 can receive location based information from an external GPS device. The main controller 20 further includes an authentication module (AM) 56 which is be used for ensuring encryption and authentication of communication between the main controller 20 and an external network interface. One example of the authentication module 56 can be an authentication chip or a processor providing specific authentication parameters or keys. The main controller 20 contains a wireless radio 58 to communicate to portable mobile devices for data access and configuration and uses a communication protocol (for example, Modbus) 62 for communications.

With the main controller 20 and the plurality of expandable modules 7(1-n), an end user does not have to deal with multiple entities or vendors or products for the installation of a separate systems. There won't be individual measurement and control systems that may have proprietary communication protocols which may preclude them from communicating with each other or to use an integrated monitoring software system. The electrical power distribution subsystem 22 does not require installing separate systems which may require their own power supplies, interconnection elements etc.

Figure 2:
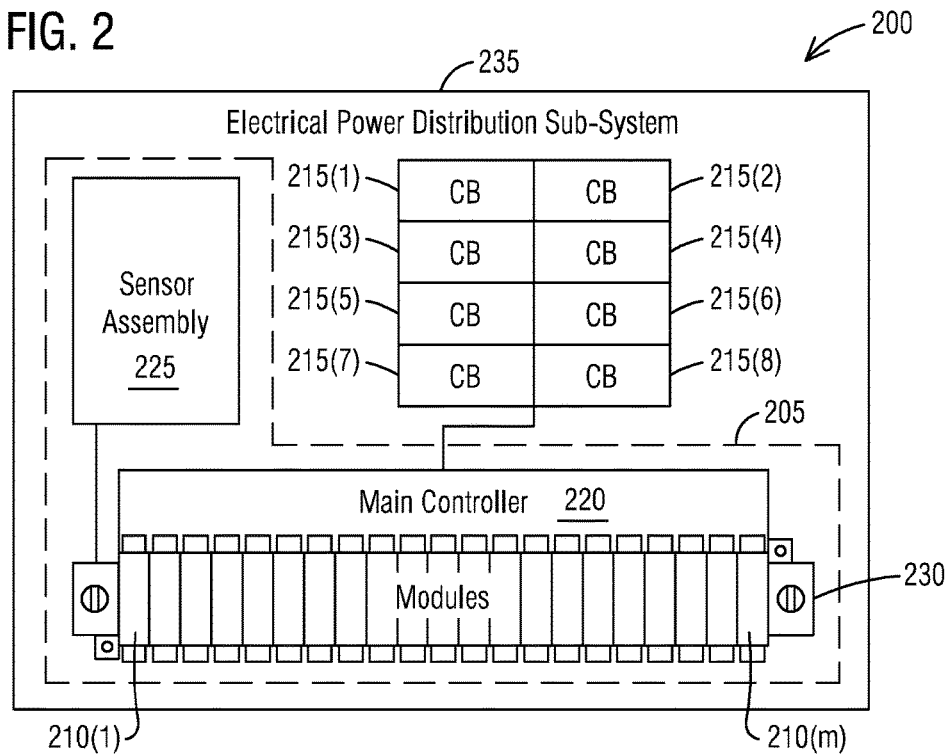
FIG. 2 illustrates a representation of an integrated programmable multi-sensor measurement and control system that addresses expandable modules in applications in accordance with an exemplary embodiment of the present invention.

Referring to FIG. 2, it illustrates a representation of an electrical power distribution system 200 including an integrated programmable multi-sensor measurement and control system 205 that addresses a plurality of expandable modules 210(1-m) in applications in accordance with an exemplary embodiment of the present invention. The electrical power distribution system 200 includes a plurality of circuit breakers 215(1-x) such as 215(1-8). The integrated programmable multi-sensor measurement and control system 205 includes a main controller 220 coupled to the plurality of expandable modules 210(1-m). The integrated programmable multi-sensor measurement and control system 205 further includes a sensor assembly 225 coupled to each of the plurality of expandable modules 210(1-m). The main controller 220 is coupled to a module rack 230.

The electrical power distribution system 200 includes a housing 235 that may be integrated with any one of a panel-board, a switchboard, a switchgear, or a busway panel. The housing 235 may be an enclosure which represents an example of installing the main controller 220 and the plurality of expandable modules 210(1-m) as discussed into one type of installation. This installation only presents an example of the integrated programmable multi-sensor measurement and control system 205 in a panel-board. Different module racks may be used. Addressing of the plurality of expandable modules 210(1-m) is based on a definition of slider switches, dip switches and rotary switches with which a unique address of the plurality of expandable modules 210(1-m) can be identified.

Figure 3:
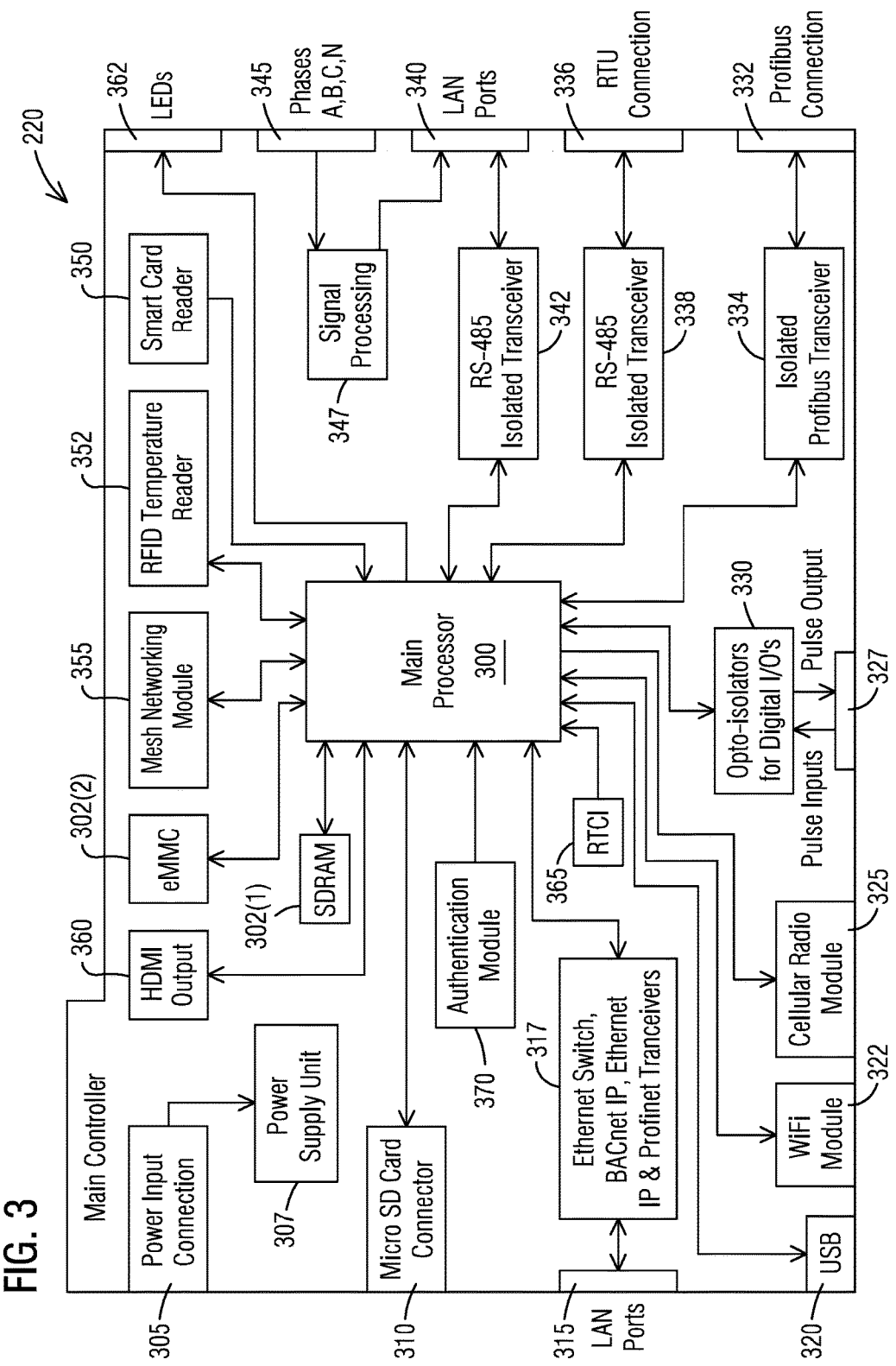
FIG. 3 illustrates details of a main controller in accordance with an exemplary embodiment of the present invention.

Turning now to FIG. 3, it illustrates details of the main controller 220 in accordance with an exemplary embodiment of the present invention. The main controller 220 may include a main processor 300 such as an ARM based processor running an operating system such as embedded Linux OS. For the functioning of such a processor it requires several external peripherals. Examples of the peripherals include a random Access Memory module such as SDRAM 302(1) to perform temporary storage or calculation of information for the main controller 220. Examples of the peripherals include an embedded multimedia card (eMMC) 302(2) to hold non-volatile memory element for the storage of the application software for the main controller 220.

The main controller 220 will also require additional peripherals to perform several functionalities/features as needed. Examples of the additional peripherals include a power input connection 305. Depending on an end application, the main controller 220 may be powered through AC or DC power supplies unit 307. Examples of the additional peripherals further include a micro SD card connector 310. This micro SD card connector 310 is an external connector interface that allows an external storage/memory unit such as a micro SD card to be inserted to the main controller 220. The main controller 220 may include local area network ports (LAN) ports 315—such as Ethernet ports/RJ45 ports which may be used to allow the main controller 220 to be accessible to the external software and hardware interfaces to allow connectivity over various protocols 317 such as TCP/IP, BACnet, Ethernet IP, Profinet among others. The main controller 220 may include a Universal Serial Bus (USB) port interface 320 that allows an external storage/memory unit such as a USB device to be connected to the main controller 220. Additionally the USB port may be utilized to connect other user interface devices such as a keyboard or mouse or allow other USB hosted services such as a USB mounted cellular radio interface as an alternate to the internal cellular radio module 325.

The main controller 220 may include a Wi-Fi module 322. The Wi-Fi module 322 may be a hardware module designed to function as a Wi-Fi control unit to facilitate a Wi-Fi connection with an external Wi-Fi network. The main controller 220 may include a cellular radio module 325. The cellular radio module 325 may be a hardware module designed to function as a cellular radio control unit to facilitate a cellular connection with an external cellular network. The main controller 220 may include pulse input/output connector 327. The pulse input/output connector 327 may provide an interface for digital pulse input and digital pulse output capability for the main controller 220 to be interfaced with other external entities which provide digital pulses or get actuated by digital pulses. The main controller 220 may include opto-isolators 330 that may be used to provide additional electrical isolation to the main controller 220 from external entities.

The main controller 220 may include a Profibus connection interface 332. Through an electrically isolated Profibus transceiver 334, the Profibus connection interface 332 may provide a connection to external devices which are communicating through the Profibus protocol. The main controller 220 may include a remote terminal units (RTU) connection interface 336. Through an electrically isolated RS485 transceiver module 338, the RTU connection interface 336 may provide a connection to external devices which are communicating through the Modbus protocol.

The main controller 220 may include LAN ports 340 for a module connection. Using isolated RS485 transceivers 342, the LAN ports 340 may be used to provide communication between the main controller 220 and associated module rack housing the modules 7(1-n) or 210(1-m) using the Modbus protocol. The programmable multi-sensor measurement and control system 5 or the integrated programmable multi-sensor measurement and control system 205 may use the Modbus protocol which is a serial communication protocol for industrial electronic connected devices. A master device/supervisory control unit communicates with multiple (slave) remote terminal units (RTU) either through a serial hardware interface or through a TCP/IP interface.

The main controller 220 may include a phase inputs interface 345. The main controller 220 may also be interfaced with external phases (A, B, C and Neutral(N)) in a electrical distribution system to achieve two purposes: AC power in case the system is powered through AC power and/or voltage and limited voltage related power quality information which can be further analyzed and processed in a signal processing block 347. The main controller 220 may include a smart card reader 350. The main controller 220 may function as a smart card reader interface in case of usage of the main controller 220 in a kiosk or a customer interface unit. The main controller 220 may include a RFID temperature reader 352. The main controller 220 may also interface with stand alone passive environment sensors such as temperature sensors, pressure sensors which get actuated by a radio module to read and receive information. The main controller 220 may include a thread or mesh networking module 355. The main controller 220 may also house a radio module to communicate to thread or mesh network. The main controller 220 may include a HDMI output interface 360. The main controller 220 may function with a paired display device such as a monitor to provide certain video information through the HDMI protocol to be displayed on the external display device. The main controller 220 may include LEDs 362 for displaying status information. The main controller 220 may include a real-time clock interface (RTCI) 365. The main controller 220 may include an authentication module (AM) 370.

Figure 4:
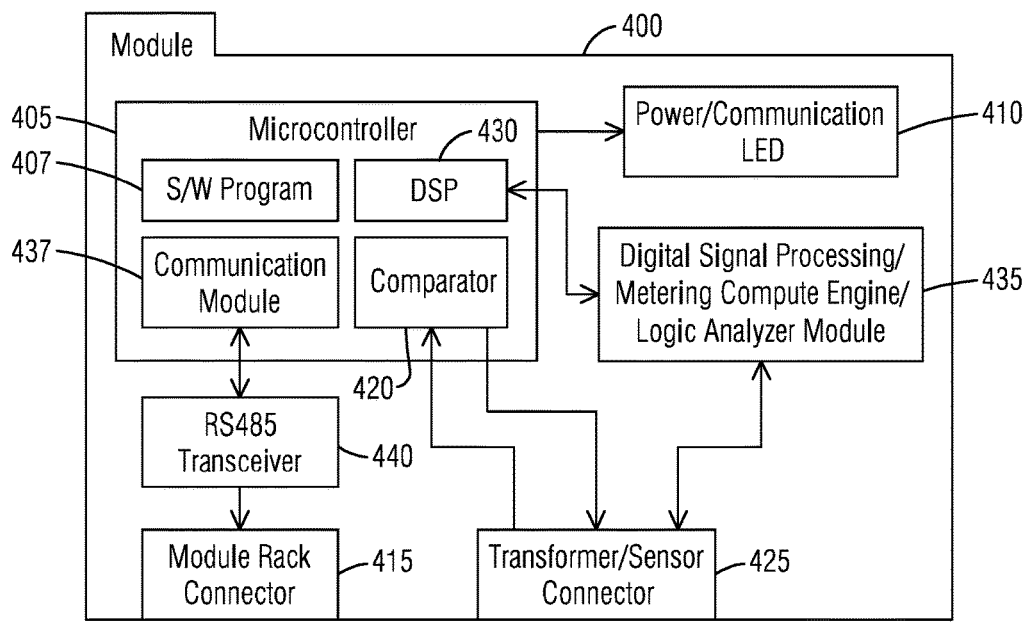
FIG. 4 illustrates details of a programmable module in accordance with an exemplary embodiment of the present invention.

FIG. 4 illustrates details of a programmable and addressable module 400 in accordance with an exemplary embodiment of the present invention. The programmable and addressable module 400 includes a microcontroller 405. The microcontroller 405 serves the purpose of housing a software program 407 to control a power or communication LED 410 indication, contains a software module to handle the communication with a module rack through a module rack connector 415 and through the module rack to an external main controller of the system, contains a software module to handle a comparator block 420 for the input signals received from the transformer/sensor through a transformer/sensor connector 425, and contains a digital signal processing (DSP) software module 430 to make further analysis of the signal(s) provided by a DSP/metering compute engine/logic analyzer 435. The microcontroller 405 includes a communication module 437 that provides a communication capability.

The DSP/metering compute engine/logic analyzer 435 has a hardware/software module that can perform stand alone digital signal processing on the incoming signals from a sensor assembly through the sensor connector interface. A compute engine can be an off-the-shelf analog ASIC or a custom mixed signal ASIC performing additional activities such as calculating the metering components from the voltage and current signals provided by the external sensors. The compute engine may also perform power quality measurement based on the current components. It may also act as a logic analyzer for the external logic assemblies such as digital control input/output elements. The programmable and addressable module 400 further includes a RS485 transceiver 440 being a hardware block that controls the reception and transmission of information through the module rack connector 415.

Figure 5:
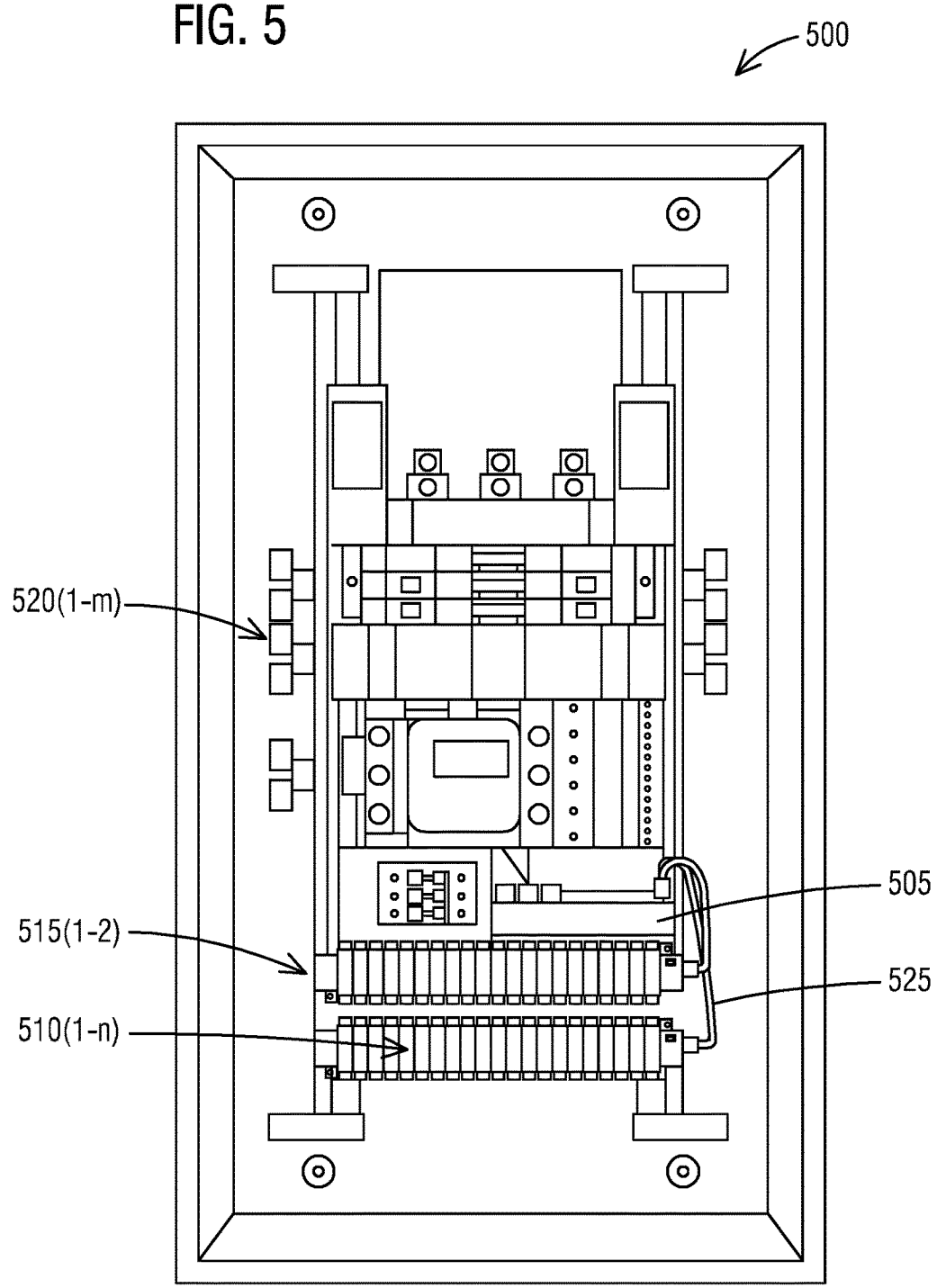
FIG. 5 illustrates a front view of an installed programmable multi-sensor measurement and control system in accordance with an exemplary embodiment of the present invention.

As seen in FIG. 5, it illustrates a front view of an installed programmable multi-sensor measurement and control system 500 in accordance with an exemplary embodiment of the present invention. The installed programmable multi-sensor measurement and control system 500 includes a main controller 505, a plurality of modules 510(1-n) such as meter modules, a plurality of module racks 515(1-r) such as 515(1-2), a plurality of current transformers (CTs) 520(1-m), and an isolated cat6 cable 525. Current Transformers (CT) are components used in AC current measurement. It is a passive component. The current measured flows in a power system conductor. The output of the CT is a scaled down current that is converted to voltage through a burden resistor within the module.

By using a web-enabled configuration and real-time data display one can view a system information (such as voltage, current, power and energy) readings from anywhere using standard web browsers like Internet Explorer and Chrome. The web-enabled configuration may provide authenticated access to many common functions such as system settings, global settings, branch configuration, real-time data, diagnostics, data logging and user management.

Figure 6:
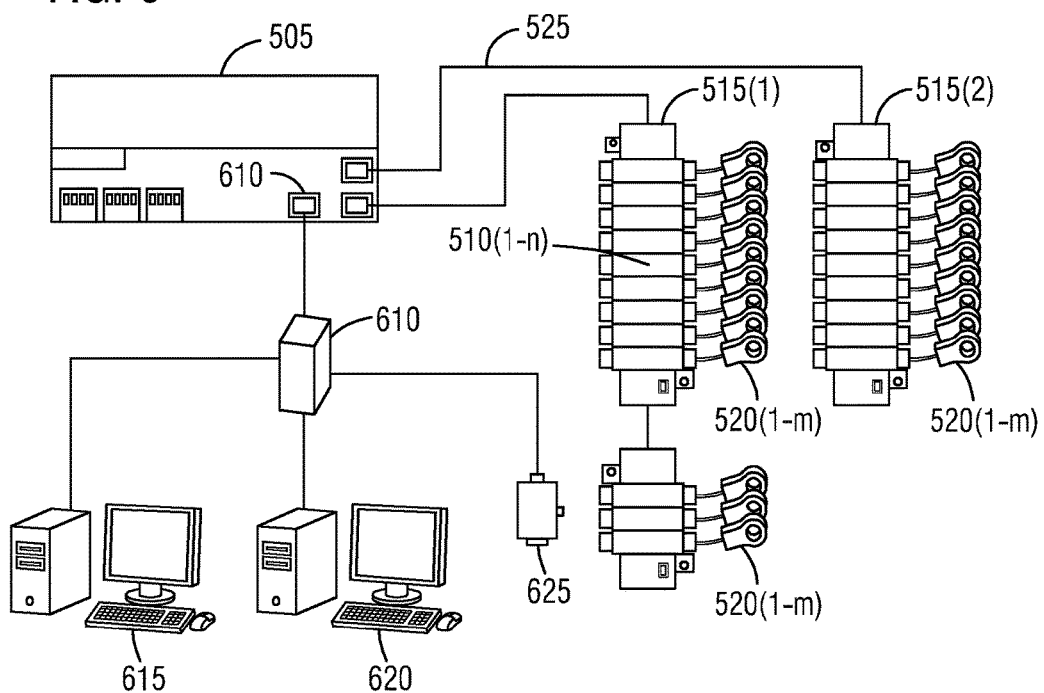
FIG. 6 illustrates an exploded view of the installed programmable multi-sensor measurement and control system of FIG. 5 in accordance with an exemplary embodiment of the present invention.

As shown in FIG. 6, it illustrates an exploded view of the installed programmable multi-sensor measurement and control system 500 of FIG. 5 in accordance with an exemplary embodiment of the present invention. The installed programmable multi-sensor measurement and control system 500 includes the main controller 505, the plurality of modules 510(1-n), the plurality of module racks 515(1-r), the plurality of current transformers (CTs) 520(1-m), and the isolated cat6 cable 525.

The installed programmable multi-sensor measurement and control system 500 further includes a Modbus TCP/IP interface 605 and a switch 610 coupled to it. The switch 610 may be coupled to an electrical power monitoring system 615 and a building management system 620 and an external off the shelf protocol translator 625. A plurality of module racks 515(1-r) (e.g., left rail of the module racks 515(1-2) and a right rail of the module racks 515(1-2)) may be connected to the main controller 505.

Figure 7:
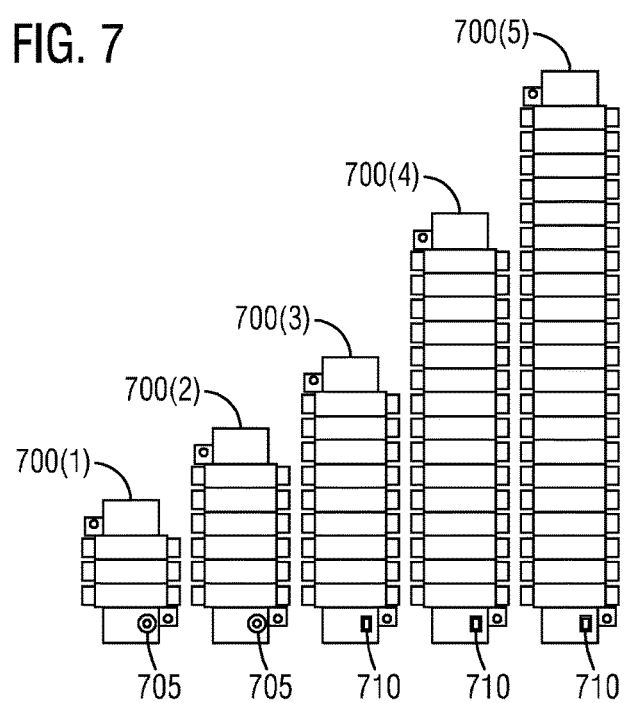
FIG. 7 illustrates a top view of a variety of module racks having different position defining and sensing mechanisms according to another exemplary embodiment of the present invention.

In FIG. 7, it illustrates a top view of a variety of module racks 700(1-5) having different position defining and sensing mechanisms according to another exemplary embodiment of the present invention. The module racks 700(1-5) are holders for the modules 510(1-n). Embedded within a rack are the internal addressing for the communication of information from the modules 510(1-n) to the main controller 505 via Ethernet cables. A two way slider switch may be available on the 9, 15, and 21 position module racks for module addressing, whereas a rotary switch may be available to set the addressing on 3 and 6 position racks. For example, module rack positioning identified by a rotary switch 705 or a slider switch 710. An alternate method may include a several position dip switch combination which allows the user to identify the position of the modules within the racks.

Each module 510 reads the address from the module racks 700(1-5) designated by its location, and can receive information from its respective sensor element. Each module 510 in one embodiment can be an independent meter that samples I & V available signals, processes these signals using the embedded power system algorithms and communicates these parameters to the main controller 505. Phasing is set with a dip switch on the module 510 to Phase A, B, and C—standard electrical equipment is left to right, top to bottom, front to back. A green, orange, or yellow LED indicates the selected phase for the meter once the dip switch has been moved to the desired position. When the module 510 has power and is communicating properly with the controller, a LED indicating power will display a specific blink pattern.

One controller like the main controller 505 is required per system. The main controller 505 can be configured to combine single points into 1, 2, and 3 phase meters. This information either viewed in real-time or communicated to other systems through its communication interfaces.

The modular design of the installed programmable multi-sensor measurement and control system 500 allows for customization to suit large or small metering needs. The simple, snap in modules 510 facilitate easy maintenance and are adaptable to any panel-boards and all front connected switchboards, eliminating the need for large metering stations. The module 510 when inserted into the rack assembly of the module racks 700(1-5) have audible clicking when locked into position thereby providing feedback to the user of correct installation. The communications cables connect the module racks 700(1-5) to the main controller 505 and connect module racks 700(1-5) together in series. Multiple lengths are available to suit a wide variety of panel-board and switchboard configurations.

The installation of the programmable multi-sensor measurement and control system 500 with metered panel-boards and switchboards has reduced installation time and risk for the installer. There are no components to keep track of or install in the field, so losing parts or miss-wiring them is eliminated. The standard built-in web based tools within the installation of the programmable multi-sensor measurement and control system 500 allows for easy and quick view of the system information. Adding modules later is easy with the modular design and rack system of the installation of the programmable multi-sensor measurement and control system 500.

The installed programmable multi-sensor measurement and control system 500 has the ability to communicate Modbus RTU/BACnet MSTP via RS485, Modbus TCP, BACnet IP, SNMP among other protocols via an Ethernet port to outside systems. The controller web pages are also used to configure the installed programmable multi-sensor measurement and control system 500 to the application. The modules 510 are configured to snap into the rack assemblies of the module racks 700(1-5). The rack assemblies are sized by how many modules will fit into each and come in 3, 6, 9, 15 and 21 module configurations.

The installed programmable multi-sensor measurement and control system 500 can integrate the module 510 into various industry standard networks. Data that the meter measures can be made available to other devices using Modbus RTU, or Modbus/TCP. The modules 510 can in one environment provide all common active, reactive and apparent energy parameters: kWh, kVARh, and kVAh. Energy registers can be logged automatically on a programmed schedule by a supervisory system The installed programmable multi-sensor measurement and control system 500 has two digital pulse inputs built into the main controller 505. These inputs can be used for, but are not limited to, bringing water and gas measurements into the supervisory system.

Using the Modbus RTU Protocol the modules 510 can act as Modbus slave devices, making any real time data available through the Modbus RTU protocol. The Modbus master devices connected to the module 510 can access (read) this data or write data to the module's 510 registers, making device configuration changes and initiating control actions. The module 510 is configured to easily fit into the rack assembly of the module racks 700(1-5).

With regard to FIG. 8, it indicates rack addresses 800 for left setting on 9, 15 and 21 module racks and setting 0-7 on 3 module racks, 0-3 on 6 module racks. With respect to FIG. 9, it indicates rack addresses 900 for right setting on 9, 15, and 21 module racks and 8-F on 3 module racks, 4-7 on 6 module racks. The 3 and 6 module racks can be used as an extension to any of the other racks or pairs of racks. Settings must be such that no address is used more than once. Duplication of addresses will return an error on setup.

While a meter module is described here a range of one or more other types of programmable and addressable modules are also contemplated by the present invention. For example, other types of non-meter modules may be implemented based on one or more features presented above without deviating from the spirit of the present invention.

The techniques described herein can be particularly useful for a master device—slave device system architecture. Master/slave is a model of communication where one device or process has unidirectional control over one or more other devices. In some systems a master is elected from a group of eligible devices, with the other devices acting in the role of slaves. Master/slave is a model for a communication protocol in which one device or process (known as the master) controls one or more other devices or processes (known as slaves). Once the master/slave relationship is established, the direction of control is always from the master to the slave(s). While particular embodiments are described in terms of the master device—slave device system architecture, the techniques described herein are not limited to the master device—slave device system architecture but can also be used with other communication architectures—digital or analog, circuits or devices.

While embodiments of the present invention have been disclosed in exemplary forms, it will be apparent to those skilled in the art that many modifications, additions, and deletions can be made therein without departing from the spirit and scope of the invention and its equivalents, as set forth in the following claims.

Embodiments and the various features and advantageous details thereof are explained more fully with reference to the non-limiting embodiments that are illustrated in the accompanying drawings and detailed in the following description. Descriptions of well-known starting materials, processing techniques, components and equipment are omitted so as not to unnecessarily obscure embodiments in detail. It should be understood, however, that the detailed description and the specific examples, while indicating preferred embodiments, are given by way of illustration only and not by way of limitation. Various substitutions, modifications, additions and/or rearrangements within the spirit and/or scope of the underlying inventive concept will become apparent to those skilled in the art from this disclosure.

As used herein, the terms "comprises," "comprising," "includes," "including," "has," "having" or any other variation thereof, are intended to cover a non-exclusive inclusion. For example, a process, article, or apparatus that comprises a list of elements is not necessarily limited to only those elements but may include other elements not expressly listed or inherent to such process, article, or apparatus.

Additionally, any examples or illustrations given herein are not to be regarded in any way as restrictions on, limits to, or express definitions of, any term or terms with which they are utilized. Instead, these examples or illustrations are to be regarded as being described with respect to one particular embodiment and as illustrative only. Those of ordinary skill in the art will appreciate that any term or terms with which these examples or illustrations are utilized will encompass other embodiments which may or may not be given therewith or elsewhere in the specification and all such embodiments are intended to be included within the scope of that term or terms.

In the foregoing specification, the invention has been described with reference to specific embodiments. However, one of ordinary skill in the art appreciates that various modifications and changes can be made without departing from the scope of the invention. Accordingly, the specification and figures are to be regarded in an illustrative rather than a restrictive sense, and all such modifications are intended to be included within the scope of invention.

Although the invention has been described with respect to specific embodiments thereof, these embodiments are merely illustrative, and not restrictive of the invention. The description herein of illustrated embodiments of the invention is not intended to be exhaustive or to limit the invention to the precise forms disclosed herein (and in particular, the inclusion of any particular embodiment, feature or function is not intended to limit the scope of the invention to such embodiment, feature or function). Rather, the description is intended to describe illustrative embodiments, features and functions in order to provide a person of ordinary skill in the art context to understand the invention without limiting the invention to any particularly described embodiment, feature or function. While specific embodiments of, and examples for, the invention are described herein for illustrative purposes only, various equivalent modifications are possible within the spirit and scope of the invention, as those skilled in the relevant art will recognize and appreciate. As indicated, these modifications may be made to the invention in light of the foregoing description of illustrated embodiments of the invention and are to be included within the spirit and scope of the invention. Thus, while the invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the invention.

Respective appearances of the phrases "in one embodiment," "in an embodiment," or "in a specific embodiment" or similar terminology in various places throughout this specification are not necessarily referring to the same embodiment. Furthermore, the particular features, structures, or characteristics of any particular embodiment may be combined in any suitable manner with one or more other embodiments. It is to be understood that other variations and modifications of the embodiments described and illustrated herein are possible in light of the teachings herein and are to be considered as part of the spirit and scope of the invention.

In the description herein, numerous specific details are provided, such as examples of components and/or methods, to provide a thorough understanding of embodiments of the invention. One skilled in the relevant art will recognize, however, that an embodiment may be able to be practiced without one or more of the specific details, or with other apparatus, systems, assemblies, methods, components, materials, parts, and/or the like. In other instances, well-known structures, components, systems, materials, or operations are not specifically shown or described in detail to avoid obscuring aspects of embodiments of the invention. While the invention may be illustrated by using a particular embodiment, this is not and does not limit the invention to any particular embodiment and a person of ordinary skill in the art will recognize that additional embodiments are readily understandable and are a part of this invention.

It will also be appreciated that one or more of the elements depicted in the drawings/figures can also be implemented in a more separated or integrated manner, or even removed or rendered as inoperable in certain cases, as is useful in accordance with a particular application.

Benefits, other advantages, and solutions to problems have been described above with regard to specific embodiments. However, the benefits, advantages, solutions to problems, and any component(s) that may cause any benefit, advantage, or solution to occur or become more pronounced are not to be construed as a critical, required, or essential feature or component.

What is claimed is:

1. A measurement and control system comprising:
   a housing including:
      a plurality of addressable and programmable modules at least one of which including at least one of a metering element, a logic element, a control element, a monitoring element and a sensing element,
      a module rack that is expandable and having a length, wherein each of the addressable and programmable module of the plurality of addressable and programmable modules are installed on the module rack in a sequential configuration such that the each of the addressable and programmable module of the plurality of addressable and programmable modules is addressable on the module rack based on a specific physical location of the each addressable and programmable module of the plurality of addressable and programmable modules across the length of the module rack, and
      a main controller configured to communicate with the plurality of addressable and programmable modules by addressing through a communication network the each addressable and programmable module of the plurality of addressable and programmable modules; and
   an electrical power distribution sub-system coupled to the each addressable and programmable module of the plurality of addressable and programmable modules and is configured to monitor inputs and signals from the each addressable and programmable module of the plurality of addressable and programmable modules.

2. The system of claim 1, wherein the housing is integrated with any one of a panelboard, a switchboard, a switchgear, or a busway panel.

3. The system of claim 1, wherein the main controller includes:
   a plurality of Light Emitting Diodes (LEDs) to display a current status of the system, a communication status and failure modes.

4. The system of claim 1, wherein the each addressable and programmable module of the plurality of addressable and programmable modules is connected with an individual sensor assembly.

5. The system of claim 1, wherein the system uses a communication protocol which enables data to be exported through the main controller to an external electrical power monitoring system.

6. The system of claim 1, wherein the main controller provides programmability access to any downstream connected modules of the plurality of addressable and programmable modules.

7. The system of claim 1, wherein the main controller is configured to receive 3 phase voltage information when connected to 120-600 V AC, 50/60 Hz signals.

8. The system of claim 1, wherein the main controller is configured to be powered through a DC electric power supply such that the main controller distributes further a required electric power to the each addressable and programmable module of the plurality of addressable and programmable modules.

9. The system of claim 8, wherein the main controller is alternatively configured to be powered directly from an AC electric power supply instead of the DC electric power supply.

10. The system of claim 1, wherein the main controller is configured to communicate with the each addressable and programmable module of the plurality of addressable and programmable modules to program the each addressable and programmable module of the plurality of addressable and programmable modules to upgrade their firmware and modify any functional or logic blocks.

11. The system of claim 1, wherein the main controller is configured to perform a translation of collected information and provide an interface to an external source.

12. The system of claim 1, wherein the main controller is configured to monitor health of any connected modules of the each addressable and programmable module of the plurality of addressable and programmable modules by periodically performing a self test routine.

13. The system of claim 1, wherein the main controller while communicating with the logic element including programmable logic controller (PLC) modules is configured to push a configured logic to a PLC module as required.

14. The system of claim 1, wherein the main controller is configured to act as a translator or a gateway function wherein data recorded from one or more addressable and programmable modules of the plurality of addressable and programmable modules is translated to other widely used industry protocols.

15. The system of claim 1, wherein the main controller includes an embedded web server accessible by an end customer to perform on-board configuration and review of local data.

16. The system of claim 1, wherein the main controller is connected to a display device with a Human Machine Interface (HMI) wherein a user is able to view data, access and review collected information.

17. The system of claim 1, wherein the main controller is connected to auxiliary responsive devices including audible support systems or alarm devices for providing system alerts conditions or immediate responses based on collected data.

18. The system of claim 1, wherein the main controller contains a wireless radio to communicate to portable mobile devices for data access and configuration.

19. The system of claim 1, wherein the main controller to provide logging of collected information on an onboard memory interface and include removable/portable memory units for recording data logs, alarm logs, and system event logs.

20. The system of claim 1, wherein the main controller includes:
a logger to allow an end user to note a time of any events and enable a time synchronization using a Network Time Protocol (NTP);
a real-time clock interface to give software and embedded web pages a real time clock information for alternate time synchronization;
a Global Positioning System (GPS) device to record a location of the main controller using location synchronization with the GPS device and provide location based system wide topology or hierarchy of information; and
an authentication module which is be used for ensuring encryption and authentication of communication between the main controller and an external network interface.

* * * * *